(12) United States Patent
Shim

(10) Patent No.: US 7,179,675 B2
(45) Date of Patent: Feb. 20, 2007

(54) METHOD FOR FABRICATING IMAGE SENSOR

(75) Inventor: Hee Sung Shim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 118 days.

(21) Appl. No.: 11/024,663

(22) Filed: Dec. 30, 2004

(65) Prior Publication Data

US 2005/0153501 A1    Jul. 14, 2005

(30) Foreign Application Priority Data

Dec. 31, 2003    (KR) ...................... 10-2003-0101694

(51) Int. Cl.
*H01L 21/00* (2006.01)
(52) U.S. Cl. .................. 438/75; 438/75; 438/259; 438/270; 257/E21.617
(58) Field of Classification Search ........ 438/144–145, 438/152–154, 200, 211, 237, 289, 75, 259, 438/270; 257/E21.617
See application file for complete search history.

(56) References Cited

U.S. PATENT DOCUMENTS

| | | | |
|---|---|---|---|
| 2002/0090748 A1* | 7/2002 | Lee et al. .................... | 438/303 |
| 2002/0100947 A1* | 8/2002 | Lee et al. .................... | 257/412 |
| 2003/0113961 A1* | 6/2003 | Horiuchi et al. ............ | 438/157 |
| 2004/0129959 A1* | 7/2004 | Kim et al. ................... | 257/288 |

OTHER PUBLICATIONS

Wolf, Silicon Processing for the VLSI Era, 1986, Lattice Press, vol. 1, pp. 198-199.*

* cited by examiner

*Primary Examiner*—Matthew Smith
*Assistant Examiner*—Thanh Van Pham
(74) *Attorney, Agent, or Firm*—Finnegan, Henderson, Farabow, Garrett, & Dunner, L.L.P.

(57) ABSTRACT

A method for fabricating an image sensor includes forming a seed layer on a semiconductor substrate, forming a blocking layer on the seed layer, partially exposing a region for transistor in an active region of the semiconductor substrate by patterning the seed layer and the blocking layer, selectively forming a gate insulating material layer in a portion of the exposed region for transistor, filling a gate electrode material layer in the exposed region for transistor over the gate insulating material layer, forming a gate insulating layer pattern and a gate electrode pattern by selectively removing the blocking layer, the gate insulating material layer, the gate electrode material layer, and the seed layer, and forming source and drain diffusion layers and a photodiode on both sides of the gate insulating layer pattern and the gate electrode pattern by selectively doping impurity ions.

7 Claims, 8 Drawing Sheets

METHOD FOR FABRICATING IMAGE SENSOR

This application claims the benefit of priority to the Korean Application No. P2003-101694, filed on Dec. 31, 2003, which is hereby incorporated by reference.

BACKGROUND

1. Technical Field

The present invention relates to a method for fabricating an image sensor, and more particularly, to a method for fabricating an image sensor whose quality is improved by improving a formation mechanism of a gate insulating layer pattern and improving a doping sequence of impurity ions of a gate electrode pattern.

2. Discussion of the Related Art

Electronic appliances such as video cameras, digital cameras, personal computers with a small sized camera, and cellular phones with a small sized camera have been widely used. These electronic appliances use image sensors to capture images. Conventional image sensors include a charge coupled device (CCD) and a CMOS image sensor. A CCD has several drawbacks in that a high driving voltage and an additional circuit are required and the process cost is high. In contrast, a CMOS image sensor based on CMOS circuit technologies is generally used to replace a CCD, because a CMOS image sensor requires low driving voltage and no additional circuit is required, and is cheaper to manufacture.

A method for fabricating a conventional image sensor is described with reference to FIG. 1A to FIG. 1E.

As shown in FIG. 1A, an active region of a semiconductor substrate 1 is defined by a device isolation region 2, and a screen insulating layer 4 is grown on the surface of semiconductor substrate 1. A region for photodiode in the active region is shielded by a photoresist pattern 101, and P type impurity ions are doped into the region exposed by photoresist pattern 101 to form a well 3. As shown in FIG. 1B, N type impurity ions are counter-doped into an upper portion 3a of well 3 for a transistor. As shown in FIG. 1C and FIG. 1D, after photoresist pattern 101 and screen insulating layer 4 are removed, an insulating layer 5a and a polysilicon layer 6a are formed on the entire surface of semiconductor substrate 1. Insulating layer 5a and polysilicon layer 6a are then patterned to form a gate insulating layer pattern 5 and a gate electrode pattern 6 over portion 3a of well 3 region for transistor. As shown in FIG. 1E, spacers 7 are formed on the sides of gate electrode pattern 6. Then, N type impurity ions are doped into the gate electrode pattern 6 and semiconductor substrate 1 using spacers 7 as a mask, thereby forming source and drain diffusion regions 8 and 9 on the sides of spacers 7. As a result, a transistor 10 including gate insulating layer pattern 5, gate electrode pattern 6, and source and drain diffusion regions 8 and 9 is formed. Finally, N type impurity ions and P type impurity ions are doped into the region for photodiode to form an N type diffusion layer 11 and a P type diffusion layer 12, which together constitute a photodiode 13.

Transistor 10 may serve to enlarge a depletion region of photodiode 13 by the on/off operations thereof and it is important for transistor 10 to have a small threshold voltage to achieve a good quality of the image sensor. The doping of N type impurity ions into upper portion 3a of well 3 as shown in FIG. 1B is generally performed to reduce the threshold voltage of transistor 10. However, the doping in upper portion 3a of well 3 results in leakage currents between well 3 and source and drain diffusion regions 8 and 9, which in turn deteriorates the quality of the image sensor.

Also, as shown in FIG. 1E, impurity ions are doped both into semiconductor substrate 1 to form source and drain diffusion regions 8 and 9 and into gate electrode pattern 6. To avoid damage that may occur in the photodiode region, source diffusion region 8, which is adjacent to photodiode 13, is doped at a concentration lower than drain diffusion region 9.

Consequently, the impurity ion concentration in a region 6a of gate electrode pattern 6 adjacent to photodiode 13 is different from that in a region 6b of gate electrode pattern 6 adjacent to drain diffusion region 9, which also deteriorates the performance of gate electrode pattern 6 as well as the quality of the image sensor.

SUMMARY

A method for fabricating an image sensor includes forming a seed layer on a semiconductor substrate, forming a blocking layer on the seed layer, partially exposing a region for transistor in an active region of the semiconductor substrate by patterning the seed layer and the blocking layer, selectively forming a gate insulating material layer in a portion of the exposed region for transistor, filling a gate electrode material layer in the exposed region for transistor over the gate insulating material layer, forming a gate insulating layer pattern and a gate electrode pattern by selectively removing the blocking layer, the gate insulating material layer, the gate electrode material layer, and the seed layer, and forming source and drain diffusion layers and a photodiode on both sides of the gate insulating layer pattern and the gate electrode pattern by selectively doping impurity ions.

DETAILED DESCRIPTION

Reference will now be made in detail to the embodiments consistent with the present invention, examples of which are illustrated in the accompanying drawings. Wherever possible, the same reference numbers will be used throughout the drawings to refer to the same or like parts.

A method for fabricating an image sensor consistent with the present invention may be described with reference to FIGS. 2A–2I.

Figure 1A:
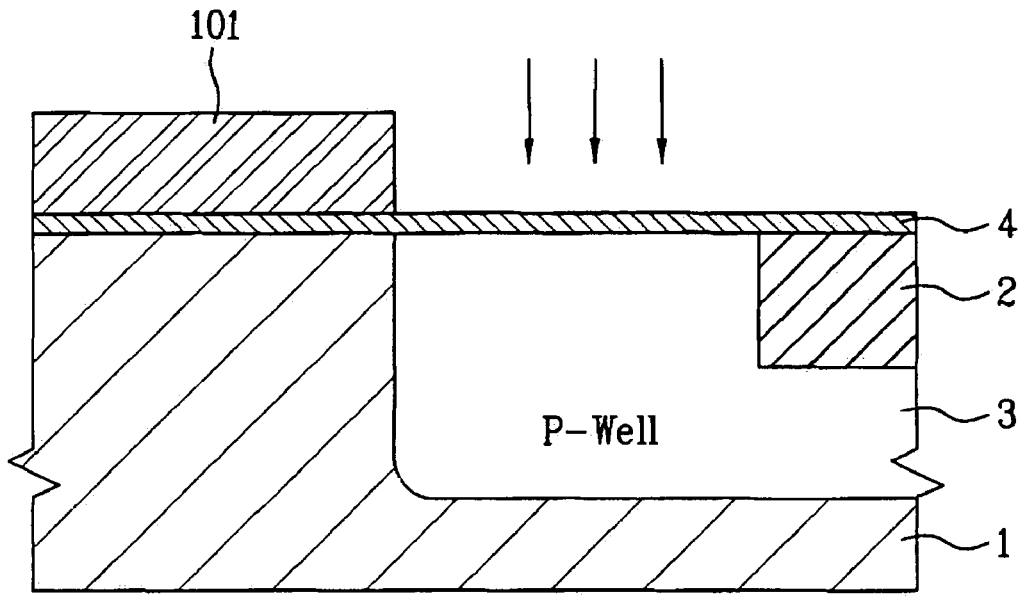
FIG. 1A to FIG. 1E are sectional views illustrating a method for fabricating a conventional image sensor.
Figure 1B:
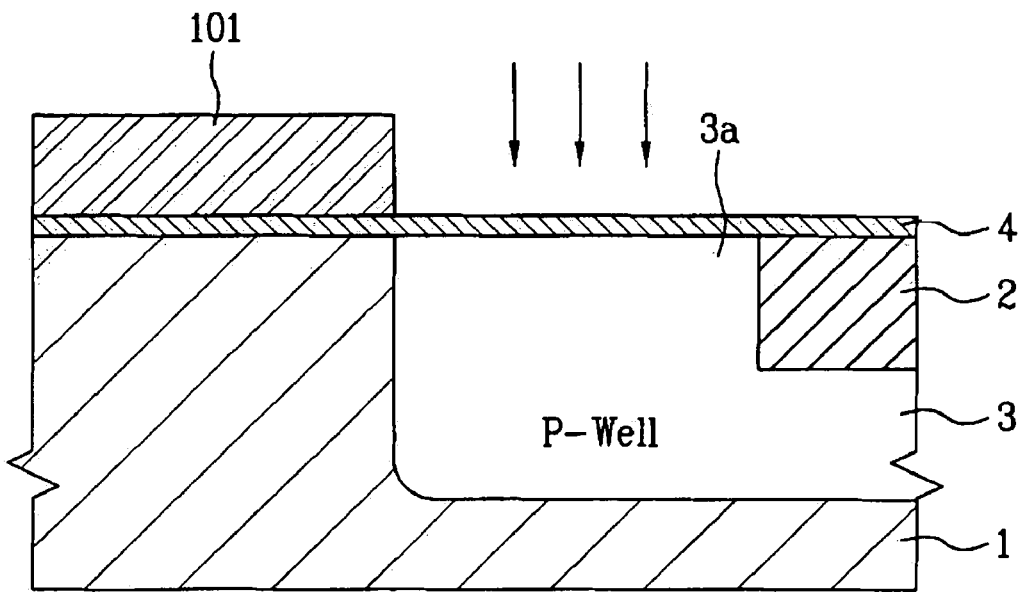
Figure 1C:
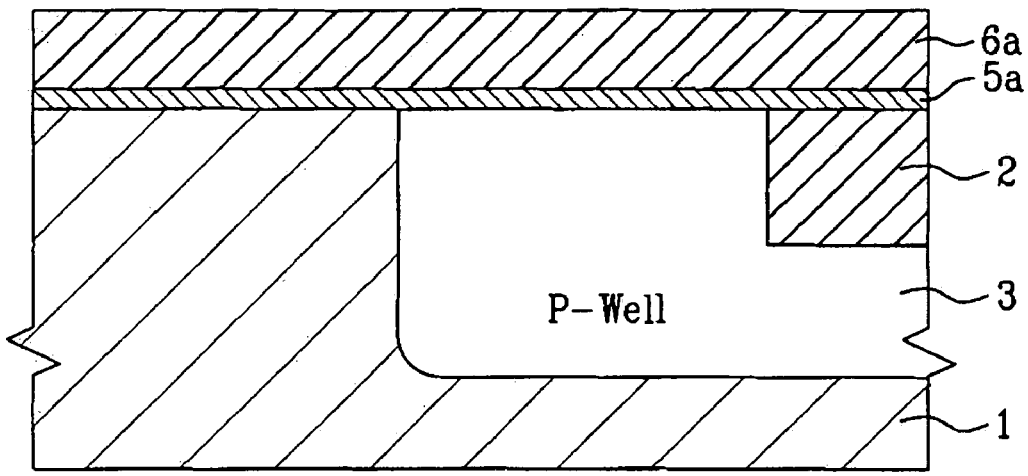
Figure 1D:
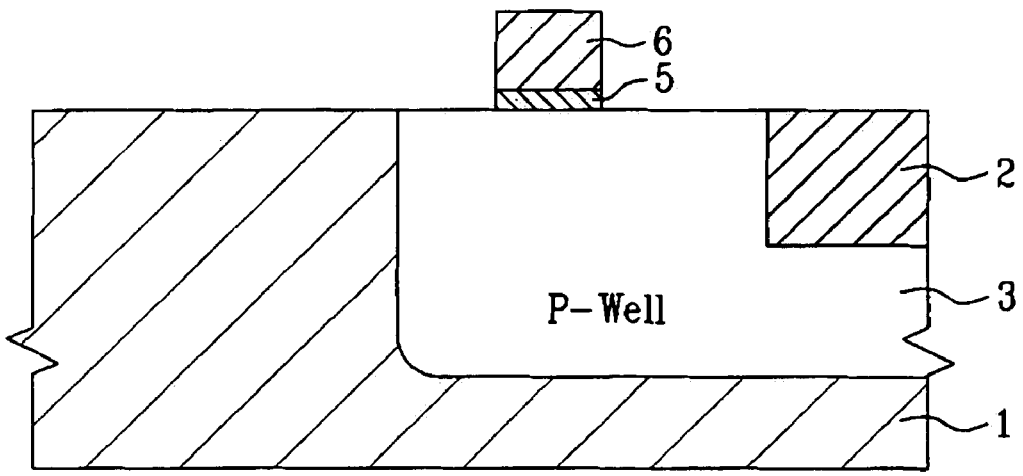
Figure 1E:
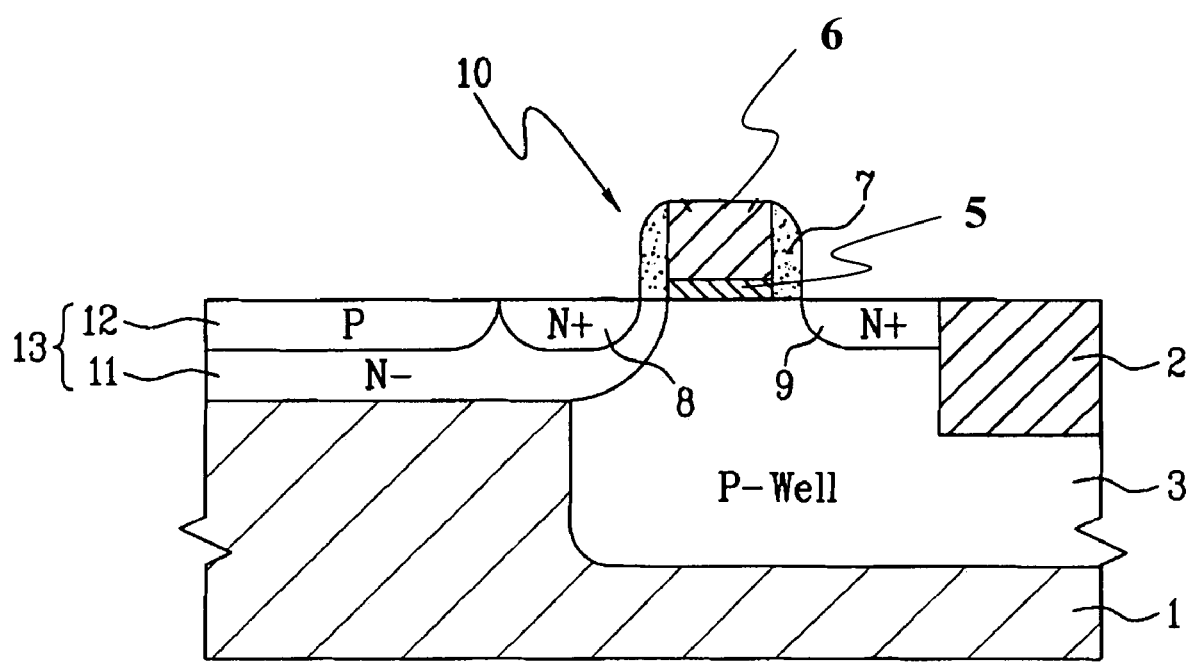
Figure 2A:
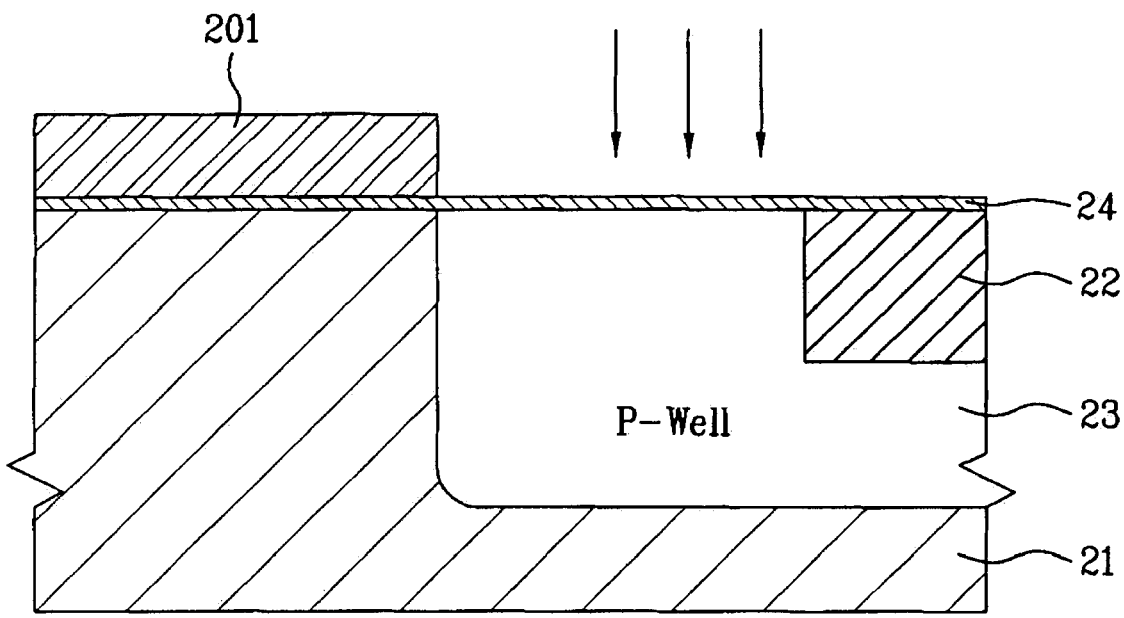
FIG. 2A to FIG. 2I are sectional views illustrating a method for fabricating an image sensor consistent with the present invention.

As shown in FIG. 2A, a device isolation region 22 is formed in a semiconductor substrate 21 by a shallow trench isolation (STI) process or a local oxidation of silicon (LOCOS) process to define an active region in semiconductor substrate 21. Semiconductor substrate 21 may be a P++ type heavily doped silicon substrate. Semiconductor substrate 21 may also include a P type epitaxial layer to increase the depth of a depletion region.

Subsequently, a screen oxide layer 24 is formed on the entire surface of semiconductor substrate 21 by a thermal oxidation process. A photoresist pattern 201 is formed on a portion of the screen oxide layer 24 and exposes a region for transistor (not numbered), and P type impurity ions are doped into the region for transistor to form a well 23. Photoresist pattern 201 and screen oxide layer 24 are then removed.

Figure 2B:
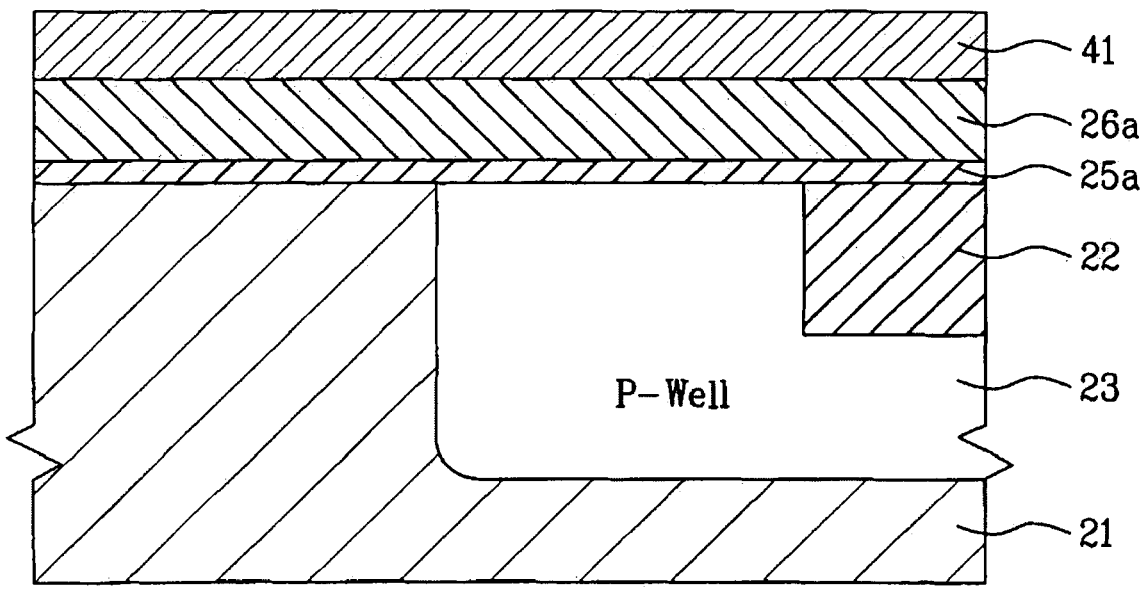

Afterwards, as shown in FIG. 2B, a first seed layer 25a comprising, for example, an oxide layer, is formed on the entire surface of semiconductor substrate 21 at a thickness between 50 Å and 55 Å by a low-pressure chemical vapor deposition process. First seed layer 25a may comprise thermal oxide layer by a thermal oxidation process. A second layer 26a comprising, for example, a polysilicon layer, is formed on first seed layer 25a by a low-pressure chemical vapor deposition process. A blocking layer 41 comprising an oxide silicon based material such as tetra ortho silicate glass (TEOS) is formed on second seed layer 26a by selectively performing a TEOS process, a high-pressure chemical vapor deposition process, a plasma chemical vapor deposition process, or a high density plasma chemical vapor deposition process (HDP CVD process).

Figure 2C:
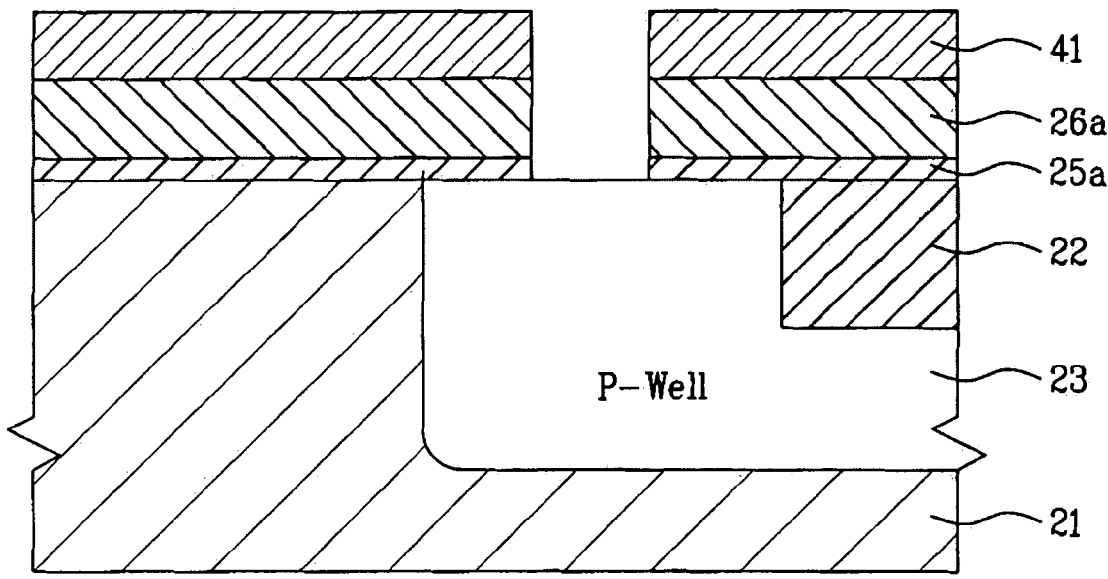

Next, as shown in FIG. 2C, seed layers 25a and 26a and blocking layer 41 are patterned by a photolithography process to expose a part of the region for transistor.

Figure 2D:
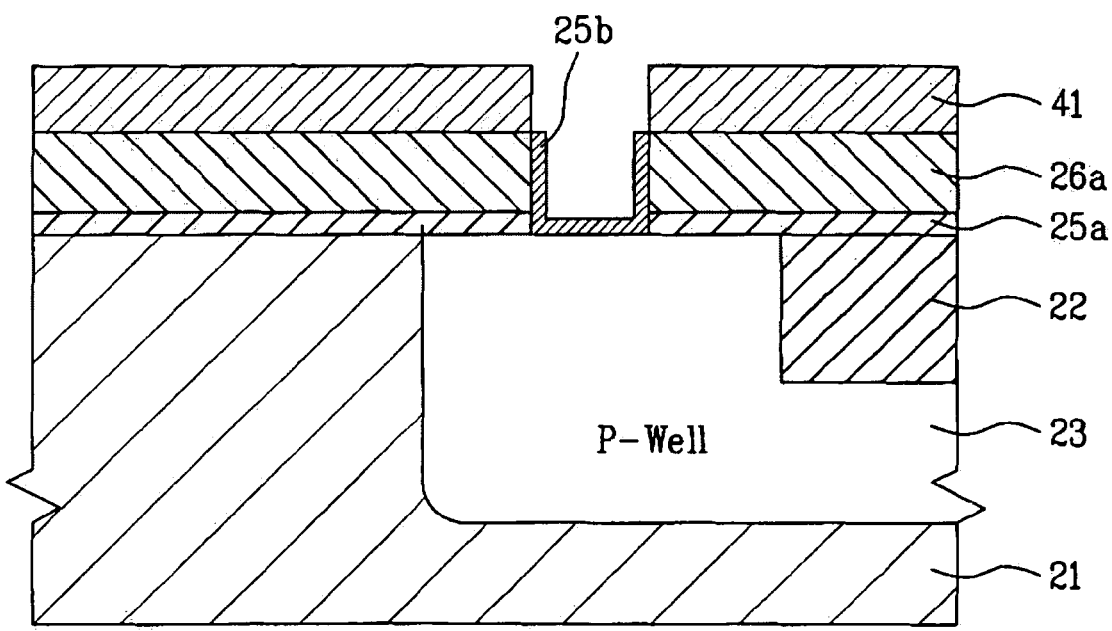

Subsequently, as shown in FIG. 2D, a gate insulating material layer 25b is formed by a thermal oxidation process on sidewalls of seed layers 25a and 26a and the exposed surface of semiconductor substrate 21 in the exposed part of the region for transistor. Gate insulating material layer 25b may have a thickness between 25 Å and 30 Å. During the thermal oxidation process, blocking layer 41 serves to prevent gate insulating material layer 25b from being unnecessarily formed in a region other than the sidewalls of seed layers 25a and 26a and the exposed surface of semiconductor substrate 21.

Figure 2E:
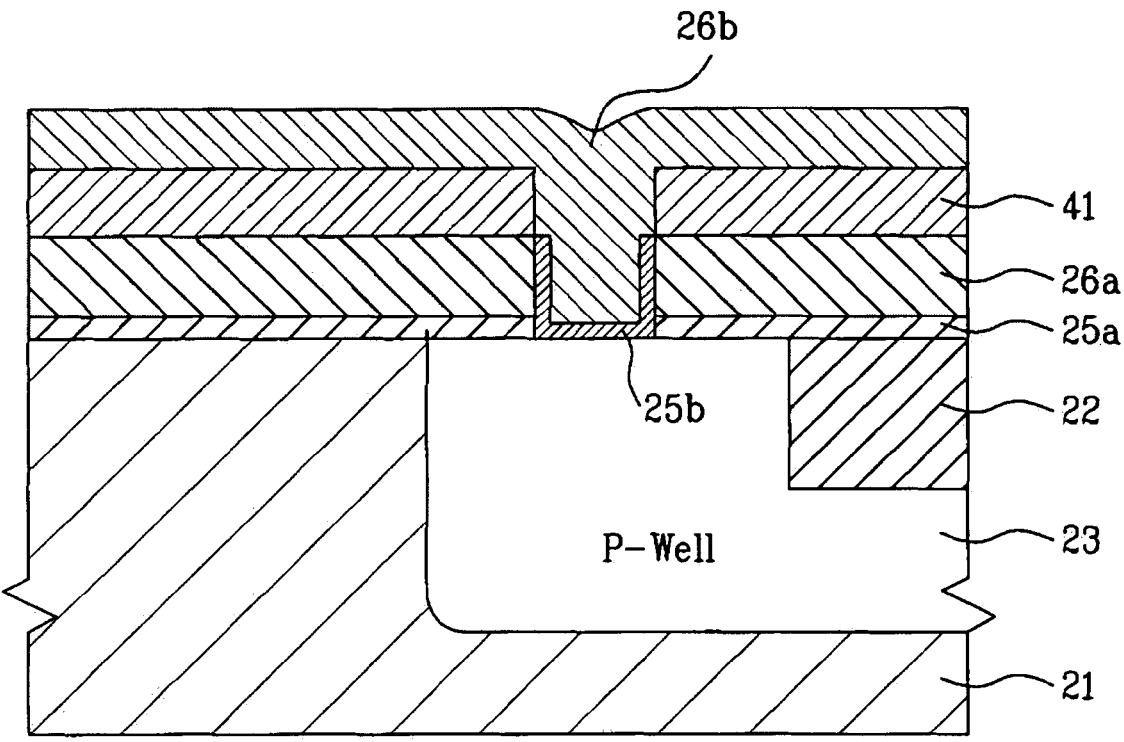
Figure 2F:
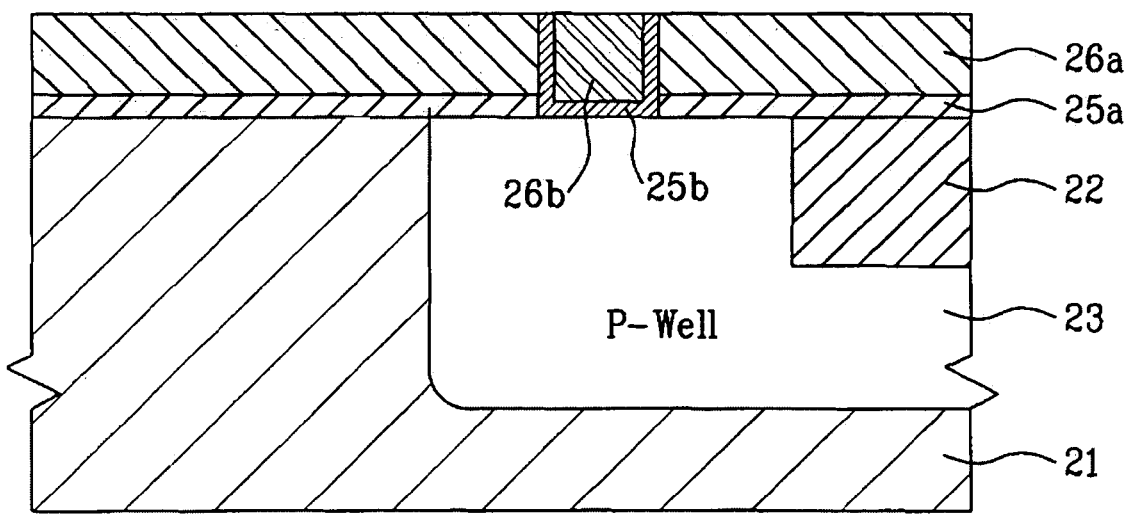

Next, as shown in FIG. 2E, a gate electrode material layer 26b comprising, for example, a thick polysilicon layer, is formed by a chemical vapor deposition process on blocking layer 41 and gate insulating material layer 25b. Gate electrode material layer 26b and blocking layer 41 are then selectively removed by a chemical-mechanical polishing process. As shown in FIG. 2F, a portion of gate electrode material layer 26b remains on gate insulating material layer 25b.

Figure 2G:
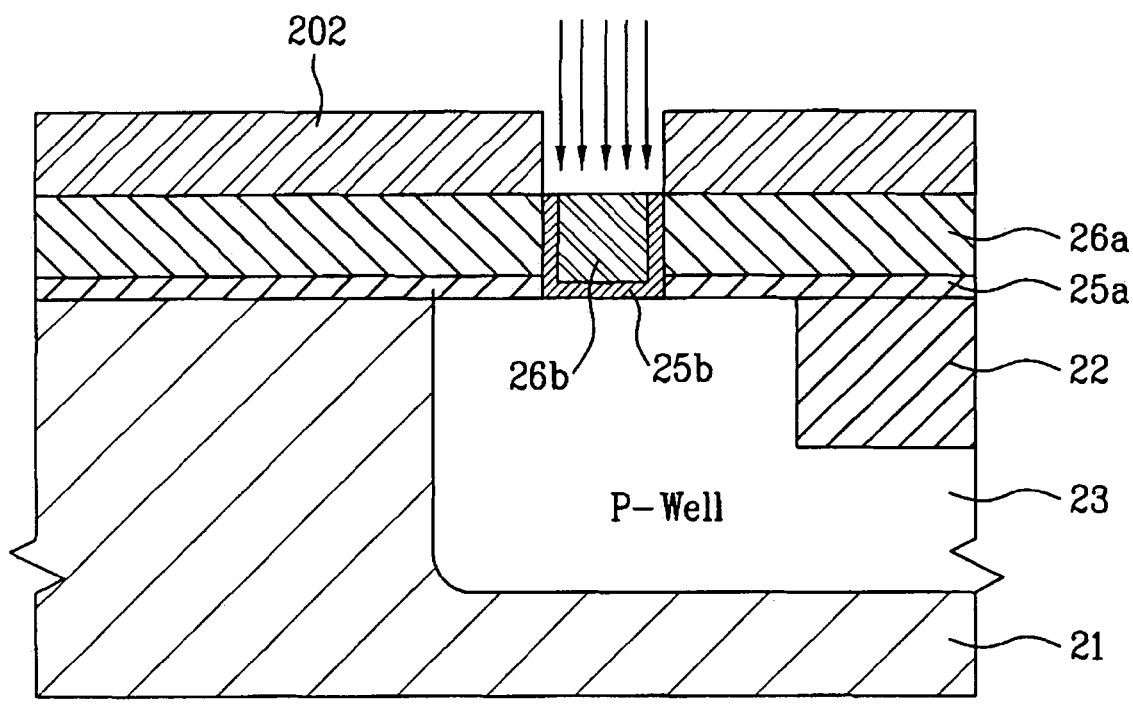

Next, as shown in FIG. 2G, a photoresist pattern 202 is formed on second seed layer 26a by depositing and patterning a layer of photoresist. Photoresist pattern 202 exposes gate electrode material layer 26b. N type impurity ions, for example, As, are heavily doped into gate electrode material layer 26b using photoresist pattern 202 as a mask. Photoresist pattern 202 is then removed.

Figure 2H:
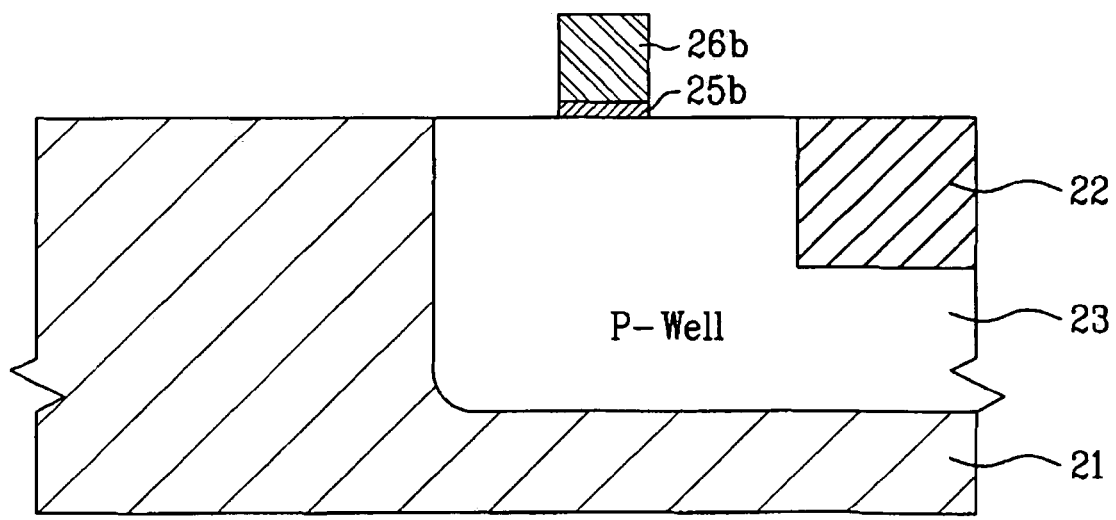

Next, as shown in FIG. 2H, a portion of the gate electrode material layer 25b on the sides of gate electrode material layer 26b and first and second seed layers 25a and 26a are selectively removed by an etching process. Thus, a structure of gate insulating layer pattern 25 and gate electrode pattern 26 is formed over the region for transistor.

Figure 2I:
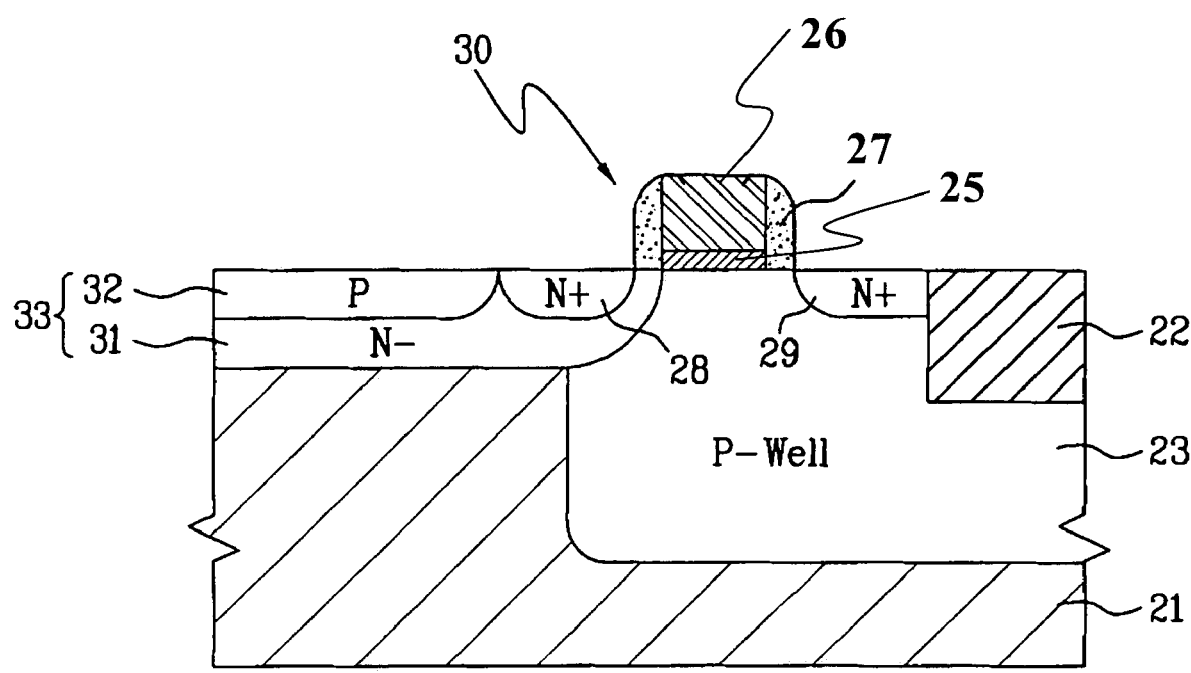

Then, as shown in FIG. 2I, spacers 27 is formed on the sidewalls of gate electrode pattern 26 and gate insulating layer pattern 25. Spacers 27 may be formed by first depositing a layer of insulating material over gate electrode pattern 26 and on the entire surface of semiconductor substrate 21 by a low-pressure chemical vapor deposition process, followed by an anisotropic dry etching process such as a reactive ion etching process. Subsequently, source and drain diffusion regions 28 and 29 are formed on the sides of gate electrode pattern 26 by heavily doping impurity ions using spacers 27 as a mask. Source and drain diffusion regions 28 and 29 and gate electrode pattern 26 constitute a transistor 30.

Also as shown in FIG. 2I, a photodiode 33 including an N type impurity ion region 31 and a P type impurity ion region 32 in semiconductor substrate 21 is formed adjacent to transistor 30.

Then, an image sensor including transistor 30 and photodiode 33 may be completed by performing additional processing steps such as forming a metal pre-insulating layer, forming a contact hole, forming a metal line, forming an insulating interlayer, forming a color pattern, forming a planarization layer, and forming a micro-lens array.

Consistent with the present invention, gate insulating material layer 25b is formed through a selective thermal oxidation of first and second seed layers 25a and 26a. As a result, gate insulating layer pattern 25, which is formed from gate insulating material layer 25b, is very thin, and the threshold voltage of transistor 30 is reduced. Consequently, a separate impurity counter-doping, which causes damage to the semiconductor substrate and leakage current, is unnecessary.

Also consistent with the present invention and as shown in FIG. 2G, gate electrode material layer 26b is doped before the formation of source and drain diffusion regions 28 and 29. Therefore, the impurity concentration in gate electrode material layer 26b may be uniform, even if source diffusion region 28, which is adjacent to photodiode 33, is doped at a lower concentration than drain diffusion region 29 so as to protect photodiode 33.

As a result of the reduced thickness of gate insulating material layer 25b and uniform impurity concentration in gate electrode layer 26b, the quality of the image sensor is improved.

Although only the formation of a transistor 30 next to a photodiode 33 was described in the above, it should be understood that the method of forming transistor 30 can be applied to form other transistors on semiconductor substrate 21.

It will be apparent to those skilled in the art that various modifications and variations can be made in the disclosed structures and methods without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating an image sensor comprising:
   forming a first seed layer on a semiconductor substrate;
   forming a second seed layer on the first seed layer, wherein the second seed layer is a first polysilicon layer;
   forming a blocking layer on the second seed layer;
   partially exposing a region for a transistor corresponding to an active region of the semiconductor substrate by patterning the first seed layer, the second seed layer, and the blocking layer;
   growing a gate insulating material layer in a portion of the exposed region by selective thermal oxidation of the first seed layer, the second seed layer, and the semiconductor substrate;
   filling a gate electrode material layer in the exposed region over the gate insulating material layer;
   forming a gate insulating layer pattern and a gate electrode pattern by selectively removing the blocking layer, the gate insulating material layer, the gate electrode material layer, and the first seed layer; the second seed layer and forming source and drain diffusion layers and a photodiode on both sides of the gate insulating layer pattern and the gate electrode pattern by selectively doping impurity ions into the semiconductor substrate a plurality of times.

2. The method of claim 1, further comprising doping impurity ions into the gate insulating material layer before forming the source and drain diffusion layers.

3. The method of claim 2, wherein doping impurity ions into the gate insulating material layer includes heavily doping impurity ions.

4. The method of claim 1, wherein forming the first seed layer includes depositing an oxide layer.

5. The method of claim 1, wherein forming the blocking layer includes forming an oxide silicon based layer.

6. The method of claim 1, wherein the gate insulating material layer is formed to have a thickness between 25 Å and 30 Å.

7. The method of claim 1, wherein forming the gate electrode material layer includes forming a second polysilicon layer.

* * * * *